United States Patent [19]
Chesley et al.

[11] Patent Number: 5,394,541
[45] Date of Patent: Feb. 28, 1995

[54] PROGRAMMABLE MEMORY TIMING METHOD AND APPARATUS FOR PROGRAMMABLY GENERATING GENERIC AND THEN TYPE SPECIFIC MEMORY TIMING SIGNALS

[75] Inventors: Gilman Chesley, Santa Cruz; Jean A. Gastinel; Fred Cerauskis, both of Mountain View, all of Calif.

[73] Assignees: Sun Microsystems, Inc., Mountain View, Calif.; Xerox Corporation, Stamford, Conn.

[21] Appl. No.: 811,825

[22] Filed: Dec. 20, 1991

Related U.S. Application Data

[63] Continuation-in-part of Ser. No. 554,283, Jul. 17, 1990, Pat. No. 5,283,877.

[51] Int. Cl.[6] .................................................. G06F 9/00
[52] U.S. Cl. ................................ 395/550; 364/270.2; 364/270.3; 364/238.4; 364/DIG. 1
[58] Field of Search .................. 395/800, 550; 365/233

[56] References Cited

U.S. PATENT DOCUMENTS

| | | | |
|---|---|---|---|
| 4,785,428 | 11/1988 | Bajwa et al. | 365/233 |
| 4,970,687 | 11/1990 | Usami | 365/233 |
| 5,202,857 | 4/1993 | Yanai | 365/233 |
| 5,276,856 | 1/1994 | Norsworthy | 395/550 |

FOREIGN PATENT DOCUMENTS 0339224  10/1989  European Pat. Off. .

OTHER PUBLICATIONS

IBM Technical Disclosure Bulletin, vol. 31, No. 9, Feb. 1989, New York, U.S.A., pp. 351–354. Entitled: Programmable Memory Controller.

IBM Technical Disclosure Bulletin, vol. 33, No. 6A, Nov. 1990, New York, U.S.A., pp. 269–272. Titled: Optimum Timing Auto-Configurable Microcoded Memory Controller.

Primary Examiner—Eric Coleman
Attorney, Agent, or Firm—Blakely Sokoloff Taylor & Zafman

[57] ABSTRACT

The present invention operates within a data processing system with multiple DRAM memory modules, providing programmable memory timing through the use of a RAM within the memory controller unit of the data processing system. This RAM, termed the MCRAM, is used to store the timing information for memory operations. In particular, the MCRAM stores for each of the memory operations, Read, Write, and Refresh, the relevant information for RAS, CAS, LD, and AD timing signals. The presently preferred embodiment of the invention contemplates a particular programming process wherein the MCRAM is initially loaded with generic timing information which is acceptable to all possible DRAM memory modules. Following this loading operation, the processor obtains the ID number of the DRAMs within a particular memory module. This ID number is used in a look-up table to obtain the vendor-specific optimal timing for DRAMs corresponding to this ID number. The processor then writes this optimal timing information into the MCRAM. Thereafter, all memory operations to this particular memory module utilize this optimal timing information.

19 Claims, 10 Drawing Sheets

MCRAM TIMING EXAMPLE

| BITS: | 10 WRLD | 9 RDLD | 8 RFAD | 7 WRAD | 6 RDAD | 5 RFCAS | 4 WRCAS | 3 RDCAS | 2 RFRAS | 1 WRRAS | 0 RDRAS |
|---|---|---|---|---|---|---|---|---|---|---|---|
| WORDS | | | | | | | | | | | |
| #0  | 0 | 0 | 1 | 0 | 1 | 0 | 0 | 0 | 0 | 0 | 1 |
| #1  | 0 | 0 | 0 | 0 | 0 | 1 | 0 | 0 | 0 | 0 | 1 |
| #2  | 0 | 1 | 0 | 0 | 0 | 1 | 0 | 1 | 1 | 0 | 1 |
| #3  | 1 | 0 | 0 | 1 | 0 | 1 | 0 | 1 | 1 | 1 | 1 |
| #4  | 0 | 0 | 1 | 0 | 1 | 0 | 0 | 0 | 1 | 1 | 1 |
| #5  | 0 | 0 | 1 | 0 | 0 | 0 | 1 | 0 | 1 | 1 | 1 |
| #6  | 0 | 1 | 0 | 0 | 0 | 0 | 1 | 1 | 0 | 1 | 1 |
| #7  | 0 | 0 | 0 | 1 | 1 | 0 | 0 | 0 | 0 | 1 | 0 |
| #8  | 0 | 0 | 0 | 0 | 0 | 0 | 0 | 0 | 0 | 1 | 0 |
| #9  | 0 | 0 | 0 | 0 | 0 | 0 | 1 | 0 | 0 | 1 | 0 |
| #10 | 0 | 0 | 0 | 1 | 0 | 0 | 1 | 0 | 0 | 0 | 0 |

PROGRAMMABLE MEMORY TIMING METHOD AND APPARATUS FOR PROGRAMMABLY GENERATING GENERIC AND THEN TYPE SPECIFIC MEMORY TIMING SIGNALS

This application is a continuation-in-part of application Ser. No. 07/554,283, filed Jul. 17, 1990, now U.S. Pat. No. 5,283,877.

BACKGROUND OF THE INVENTION

1. Field of the Invention

The present invention relates to the field of computer memories, and more particularly, to an apparatus and process for advantageously programming into a memory controller timing data used to generate timing signals for the memory modules coupled to the memory controller.

2. Art Background

Computer systems commonly utilize banks of dynamic random access memory (DRAM) for storing data and computer programs for a variety of tasks. For example, in a bit map computer display system, each pixel disposed on a cathode ray tube (CRT) display is assigned a single bit digital value to represent the pixel in memory, or a multiple bit digital value to represent color. Computers have traditionally addressed their memories in 8 bit, 16 bit, 32 bit, 64 bit or larger increments. Typically one memory cycle has the capability of transferring a predetermined number of bits. Over the years since the advent of digital computers, a variety of memory configurations and architectures have been developed to maximize the performance of data processing systems.

A number of computing systems, such as the engineering workstations manufactured by the assignee of the present application, Sun Microsystems, Inc., have provided dynamic RAM memory through the use of DRAM modules, which plug into the main printed circuit board ("mother board") of the workstation. These DRAM modules provide a known amount of memory per module, with predetermined cycle times and operating modes. For example, a DRAM module offered by the Toshiba Corporation provides 72 megabits, 36 megabits, and other combinations of RAM storage capacity, on printed circuit boards for insertion into memory expansion slots on computer mother boards.

Application Ser. No. 07/554,283, filed Jul. 17, 1990, of which this application is a continuation-in-part, disclosed an improved single in-line memory module containing a plurality of DRAMs for use in a digital computing system. The data processing system disclosed in that application utilized multiple memory modules, known as SIMMs. Each of these SIMMs contained DRAMs, and each of these DRAMs provided a known amount of memory with predetermined cycle times and operating modes.

Typically, within a system using multiple memory modules, the timing of the memory operations is fixed or hard-wired. This fixed timing, however, can present problems when replacement or substitution of DRAMs is desired. As a general matter, various DRAMs with various timing requirements are presently available on the market. Frequently, the timing requirements of a first vendor's DRAMs are different from the timing requirements of a second vendor's DRAMs. A data processing system which has fixed timing, therefore, does not necessarily allow an individual to replace the first vendor's DRAMs with the second vendor's DRAMs. In particular, within a SIMM system, fixed timing does not facilitate the replacement of a first group of SIMMs containing a first vendor's DRAMs with a second group of SIMMs containing a second vendor's DRAMs.

Perhaps most significantly, fixed timing does not allow a data processing system to take advantage of advances in DRAM timing. Each new generation of DRAMs tends to achieve faster cycle times than the previous generation of DRAMs. Ideally then, a data processing system should have programmable timing, able to adapt to each new, faster generation of DRAMs.

As will be described, the apparatus of the present invention provides for programmable memory timing in a data processing system. Once properly programmed, the programmable memory timing provides optimal timing signals for all memory operations. The present invention, therefore, allows the data processing system to readily adapt to, and take advantage of, DRAMs with different timing requirements.

SUMMARY OF THE INVENTION

The present invention operates within a data processing system having memory modules. The data processing system includes a processor coupled to a system bus. A memory controller is also coupled to the system bus and to a memory bus in communication with a group of single in line memory modules (SIMMs). A RAM is utilized within the memory controller for programmable memory timing of the data processing system. This RAM, termed the MCRAM, is used to store timing data for memory operations. In particular, the MCRAM stores for each of the memory operations, Read, Write, and Refresh, the relevant timing data used to generate the RAS, CAS, LD, and AD timing signals. When a memory cycle is started, the words of the MCRAM are clocked through sequentially, and each of the RAS, CAS, LD, and AD lines receives a particular stream of data from these words to create the requisite timing signals. The MCRAM may be advantageously programmed with timing data necessary for memory operations with respect to a first group of SIMMs, then subsequently, be programmed with timing signal data necessary for memory operations with respect to a second group of SIMMs having different timing requirements. Thus, the programmable MCRAM allows for adaptability to different groups of SIMMs having different different timing requirements without requiring a corresponding change in the memory controller architecture.

In operation, the MCRAM is initially loaded with generic timing data acceptable to any group of SIMMs which might be used in the data processing system. Following this loading operation, the processor requests a memory operation to obtain an ID byte identifying the type of the DRAMs being used in the group of SIMMs. The processor utilizes this ID byte to cross-reference a look-up table stored in memory. This look-up table contains the optimal timing data for all possible DRAMs which potentially may be used within the group of SIMMs. The processor reads from this look-up table the optimal timing data for the DRAMs corresponding to the ID byte, and writes this data into the MCRAM. Thereafter, all memory operations utilize the timing signals generated from this optimal timing data stored in the MCRAM.

DETAILED DESCRIPTION OF THE INVENTION

As will be described, the present invention finds application in systems employing multiple memory modules. In particular, the present invention is applicable to the system described in the copending parent application Ser. No. 07/554,283, filed Jul. 17, 1990, incorporated fully herein by reference. This parent application disclosed an improved single in-line memory module (SIMM) employing dynamic random access memories (DRAMs) having particular application for use by a digital computer for storing and retrieving data and programs.

In the following description for purposes of explanation, numerous details are set forth such as specific memory sizes, bandwidths, data paths, etc. in order to provide a thorough understanding of the present invention. However, it will be apparent to one skilled in the art that these specific details are not required in order to practice the SIMM system. In other instances, well known electrical structures and circuits are shown in block diagram form in order not to obscure the SIMM system unnecessarily.

Figure 1:
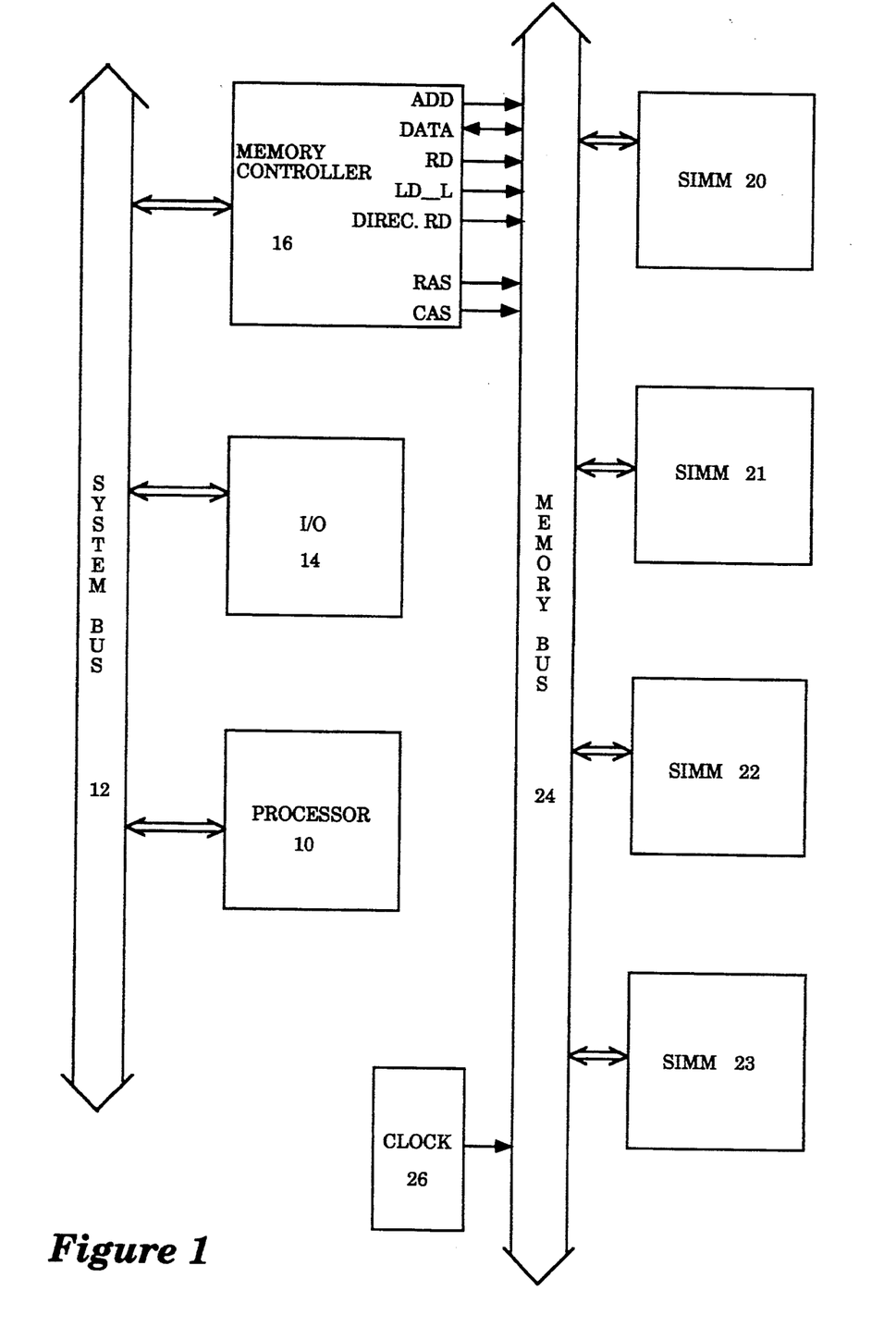
FIG. 1 is a functional block diagram of a typical data processing system employing the teachings of the present invention.

Referring now to FIG. 1, a processor 10 is coupled to a system bus 12 for communicating with various system components, including input/output devices 14, as well as a memory controller 16 which is also coupled to the system bus 12. As will be described more fully below, processor 10 stores and retrieves data, which may comprise programs and/or alphanumeric and other data in single in-line memory modules (SIMMs) 20, 21, 22, and 23. As illustrated, SIMMs 20 through 23 communicate with the memory controller 16 over a memory bus 24. In addition, a clock 26 provides timed digital clock signals over memory bus 24 to the SIMMs 20 through 23. Although FIG. 1 illustrates four single in-line memory modules coupled to memory bus 24, it will be appreciated by one skilled in the art that the SIMM system may be used with various numbers of SIMMs coupled to the memory bus 24.

In operation, processor 10 stores data in dynamic random access memory (DRAM) disposed within each of the SIMMs 20 through 23. Data to be stored by processor 10 is provided to the memory controller 16 over the system bus 12. The memory controller then couples the address of the data storage locations in the SIMMs to the memory bus 24, along with the data to be stored. As will be described, various control signals are provided by the memory controller 16 to accomplish storage as well as the retrieval of data in the SIMMs. In addition, it should be noted that row address and column address strobes for DRAMs disposed in the SIMMs are provided by the memory controller 16, and other timing signals associated with the storage and retrieval of data in the SIMMs are also provided by the memory controller 16. Accordingly, the present invention's single in-line memory module may utilize dynamic random access memory having a variety of storage capabilities, since all timing signals originate from the memory controller 16.

In the presently preferred embodiment of the SIMM system, SIMMs 20 through 23 are utilized in a memory system with a data transfer size of 64 data bytes for each transaction. In addition, 8 error check bits are provided for each 64 bits of data. Each SIMM (20 through 23) supplies 16 bits of data and 2 bits for error checking. In the presently preferred embodiment, four SIMMs are utilized to supply 72 bits for one data transfer transaction. Currently, the DRAMS utilized by the SIMM system, which are disposed in SIMMs 20 through 23, operate using a 100 nanosecond access rate, and two consecutive accesses are required to get 64 bytes of data. However, utilizing the SIMM system's cross bar switch (CBS) on each SIMM, a translation of the 32 bytes at 100 nanoseconds results in an actual data transfer rate of 8 bytes at 25 nanoseconds over the memory bus 24 to the controller 16.

Figure 2:
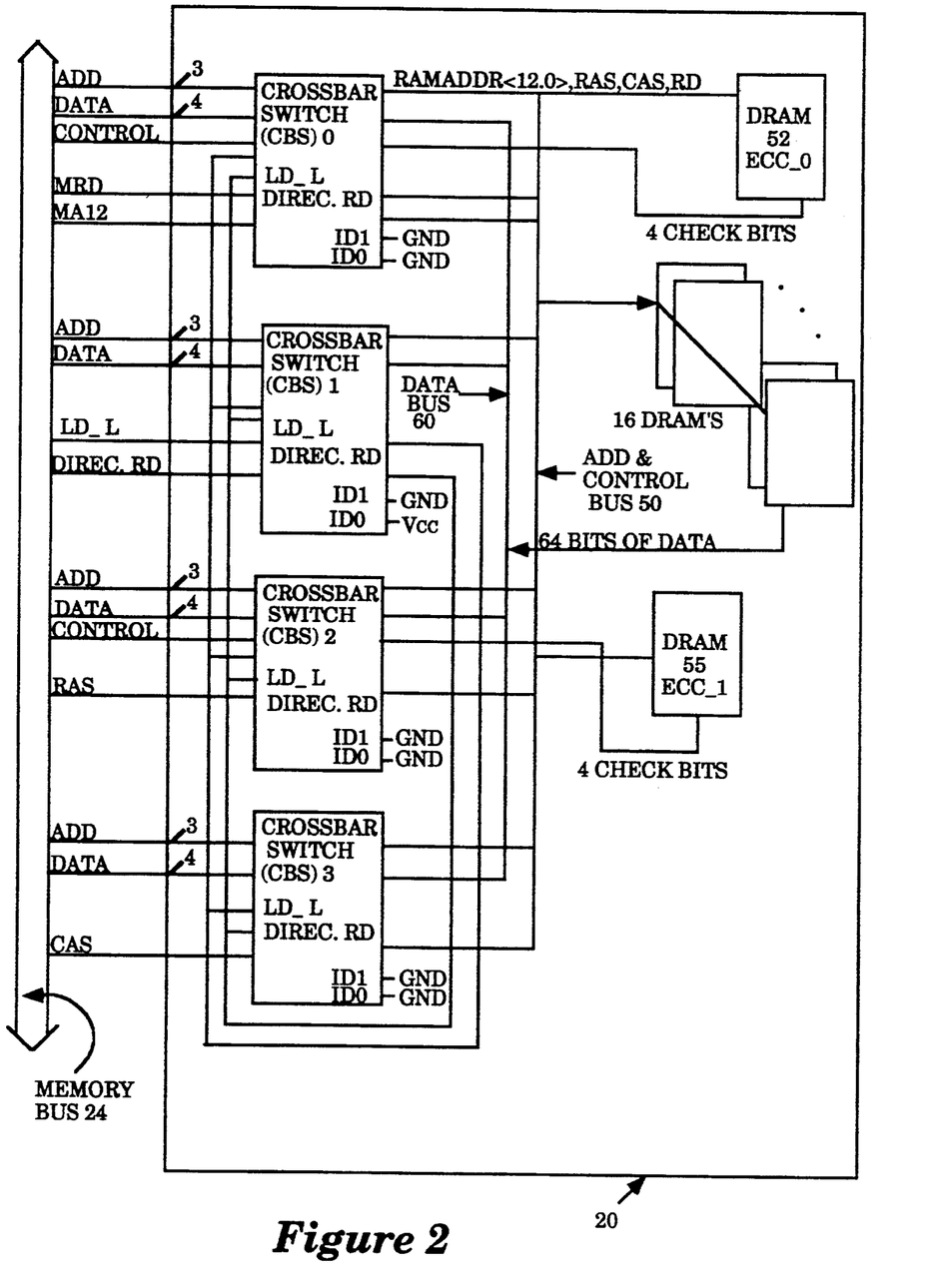
FIG. 2 is a functional block diagram illustrating the present invention's cross bar switches (CBS) disposed within each single in-line memory module (SIMM).

Referring now to FIG. 2, each SIMM (20 through 23), illustrated in FIG. 1, comprises sixteen DRAMs coupled to four cross bar switches (CBSs) including CBS0, CBS1, CBS2, and CBS3, as shown in FIG. 2. Each SIMM (for example SIMM 20 as shown in FIG. 2) includes four cross bar switches (CBS0 through CBS3), wherein each cross bar switch is coupled to the memory bus 24 as illustrated. Sixteen dynamic RAMs (DRAMs) are coupled to an address and control bus 50, and provide a total of 64 bits of data to a data bus 60, as shown. In addition, two DRAMs, shown in FIG. 2 as DRAM 52 and DRAM 55, each provide four error checking bits to two of the cross bar switches (in the case illustrated in FIG. 2, DRAM 52 provides four check bits to CBS0, and DRAM 55 provides four check bits to CBS2). As illustrated, data provided by the sixteen DRAMs is coupled to data bus 60, and thereby provided to each of the cross bar switches and ultimately transmitted on memory bus 24. In the presently preferred embodiment, each CBS comprises an ASIC, however, it will be appreciated that the cross bar switches may also be fabricated using standard cell, custom or semi-custom fabrication techniques.

In the preferred embodiment, each SIMM (see FIG. 1) provides 16 bits of data, such that the sum of the output of SIMMs 20 through 23 provide a total of 64 bits of data, which comprises one "word" in the computer system. In addition, each SIMM (20 through 23) provides two bits of error check bits, thereby resulting in an eight bit error check byte. Of the sixteen bits of data provided by each SIMM, each cross bar switch (see FIG. 2) contributes four bits of data, and as illustrated in FIG. 2, each cross bar switch provides four data lines to the memory bus 24, and is also coupled to the memory bus 24 by three address lines. The operation of each cross bar switch within the SIMM will be described more fully below.

In operation, processor 10 provides an address to read data from, or write data into, SIMMs 20 through 23. The address is coupled over the memory system bus 12 to the memory controller 16. The memory controller 16 couples the address to the memory bus 24, which, depending on the bit value of the address, parses the address bits (presently three bits at a time) to each of the respective cross bar switches on each of the SIMMs (see FIG. 2). As will be described, each cross bar switch amplifies the address, and couples its portion of the address to the address and control bus 50, such that the address bits are provided to the 16 DRAMs of FIG. 2. Addresses associated with DRAM 52 or DRAM 55 for error checking are similarly coupled to the appropriate DRAM through either CBS0 or CBS2, as illustrated in FIG. 2. In the presently preferred embodiment, the error detection and correction method used is known as "single bit error correction/double bit error detection/single-4-bit byte error detection" (SEC-DED-S4ED). However, it will be appreciated by one skilled in the art that a variety of error detection and correction mechanisms may be utilized in accordance with the teachings of the SIMM system. In addition, in the present embodiment error detection and correction is accomplished by memory controller 16, although, in other applications processor 10 may be used for these functions.

Figure 3:
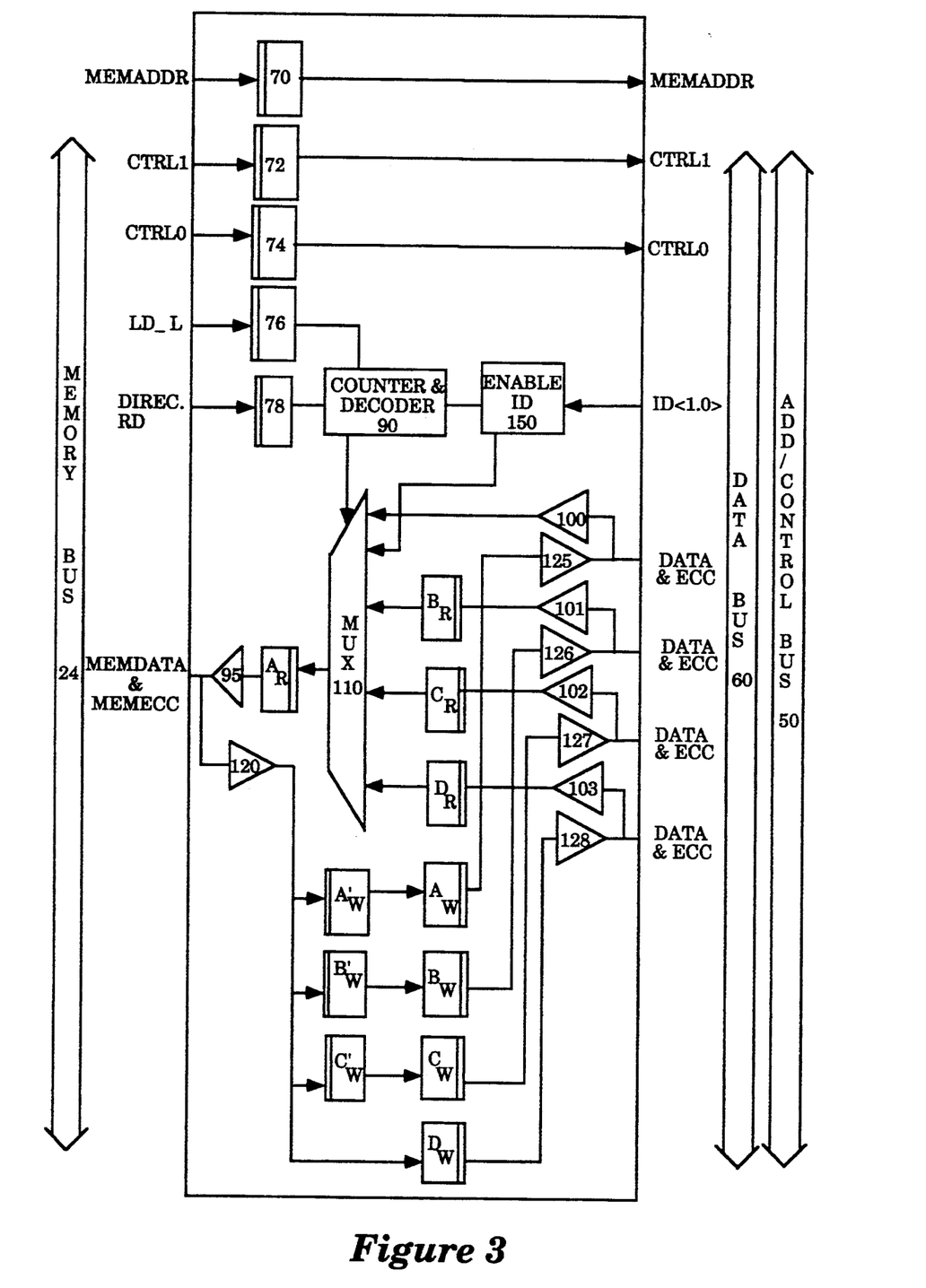
FIG. 3 is a functional block diagram of each cross bar switch utilized by the present invention.

Referring now to FIG. 3, each cross bar switch (CBS) is comprised of the elements illustrated. As shown, three lines comprising a three bit memory address (MEMADDR) is coupled from the memory bus 24 into a memory address register 70. Similarly, two lines of memory control (illustrated as a single line into each CBS of FIG. 2) are coupled, respectively, to registers 72 and 74. An LD_L control line is also coupled to the memory bus 24, and provides signals to initiate a memory access cycle, and as illustrated in FIG. 3, the LD_L line is coupled to a register 76. A direction read (Direc.RD) line provides signals which designate operations as either read or write operations into the DRAMs. The direction read signal is provided over a Direc.RD line coupled to the memory bus 24, and as shown, the line is coupled to register 78.

In operation, the CBS receives a memory address (MEMADDR) corresponding to an address in one of the SIMM DRAMs, over memory bus 24. The address and memory control signals (CTRL1 and CTRL0) are received by each CBS, and stored in register 70, 72, and 74, respectively. The CBS amplifies and retransmits the memory address to the address and control bus 50 (see FIGS. 2 and 3).

Figure 5:
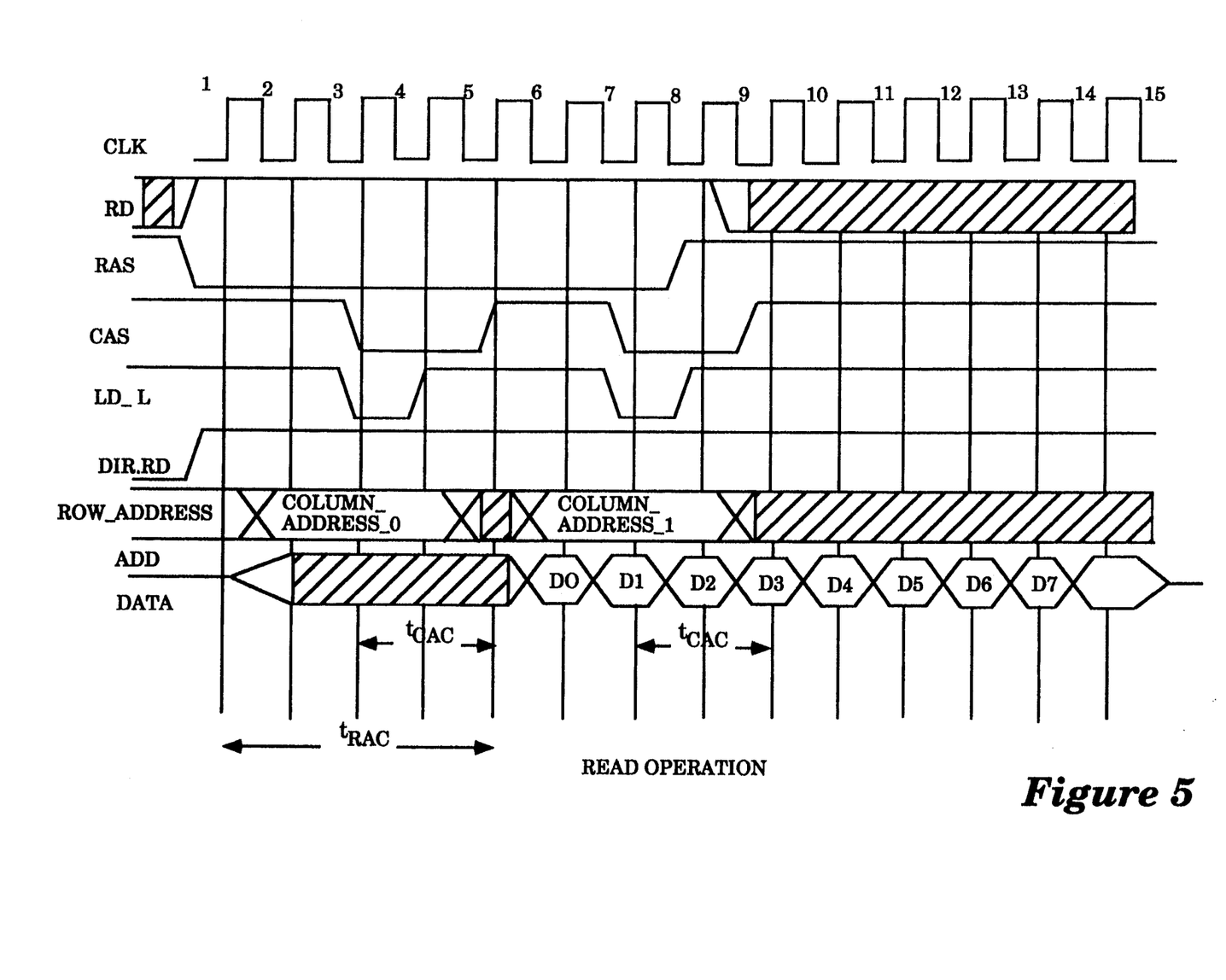
FIG. 5 is a timing diagram of various signals employed by the present invention during a read operation.

Assume for sake of example that the processor 10 initiates a read operation to retrieve data stored in SIMMs 20 through 23. Processor 10 applies the address (MEMADDR) of the stored data to system bus 12, and the address is received by memory controller 16 which applies it to the memory bus 24. As previously described, within each SIMM are disposed four cross bar switches. Each CBS within the respective SIMM receives three bits of the address along with control signals (including row address strobe (RAS) and column address strobe (CAS) signals) which are stored in register 70, 72 and 74, respectively. The address (MEMADDR) is shifted out of register 70 in each CBS and onto the address and control bus 50, which is in turn coupled to the dynamic RAMS (see FIG. 2). As best illustrated in FIG. 5, the timing of the various signals applied to the CBS is such that the memory controller 16 applies a Direc.RD signal (high) to each CBS. The Direc.RD signal is stored in register 78.

As shown in FIG. 3, a counter and decoder circuit 90 is coupled to both register 76 as well as register 78. Generally concurrent with the application of the Direc.RD signal, the memory controller 16 applies a LD_L signal (low) to register 76. The LD_L and Direc.RD signals are received by the counter and decoder 90. In a read operation, the counter and decoder 90 enables an output buffer 95, and latches data read from the DRAMs, and provided over data bus 60, into buffers 100, 101, 102 and 103, along with the respective error checking and correction bits (ECC). The retrieved data is then sent to buffers 100 through 103 after a predetermined number of cycles. Reference is made to the timing diagram of FIG. 5 for the particular sequence of signals, including RAS, CAS, LD_L and Direc.RD signal sequence utilized by the present invention.

The counter and decoder 90 further controls multiplexer 110, such that once data read from the DRAMs is received in buffers 100 through 103, the following steps occur: Immediately upon receiving the first four bits of data in buffer 100, the data in buffer 100 is transferred through the multiplexer 110, and stored in register $A_R$. At the same time, data received in buffers 101, 102 and 103 is stored is registers $B_R$, $C_R$, and $D_R$. Substantially concurrent with the receipt of data in register $A_R$, the four bits of data stored in register $A_R$ are shifted out over MEM DATA lines, in parallel to the memory bus 24. Once the data bits stored in register $A_R$ are shifted through the output buffer 95, multiplexer 110, as controlled by counter and decoder 90, sequentially selects registers $B_R$, $C_R$, and $D_R$ such that the contents of these registers are also shifted out onto the memory bus 24 through the output buffer 95. In addition to the four bits of data shifted through output buffer 95 in each CBS in a SIMM, an additional one error checking bit (ECC) is also provided. It will be appreciated from the previous discussion of the structure and operation of each SIMM, that the 16 bits of data outputted from each CBS form a 64 bit data word along with an 8 check bits (ECC).

Figure 4:
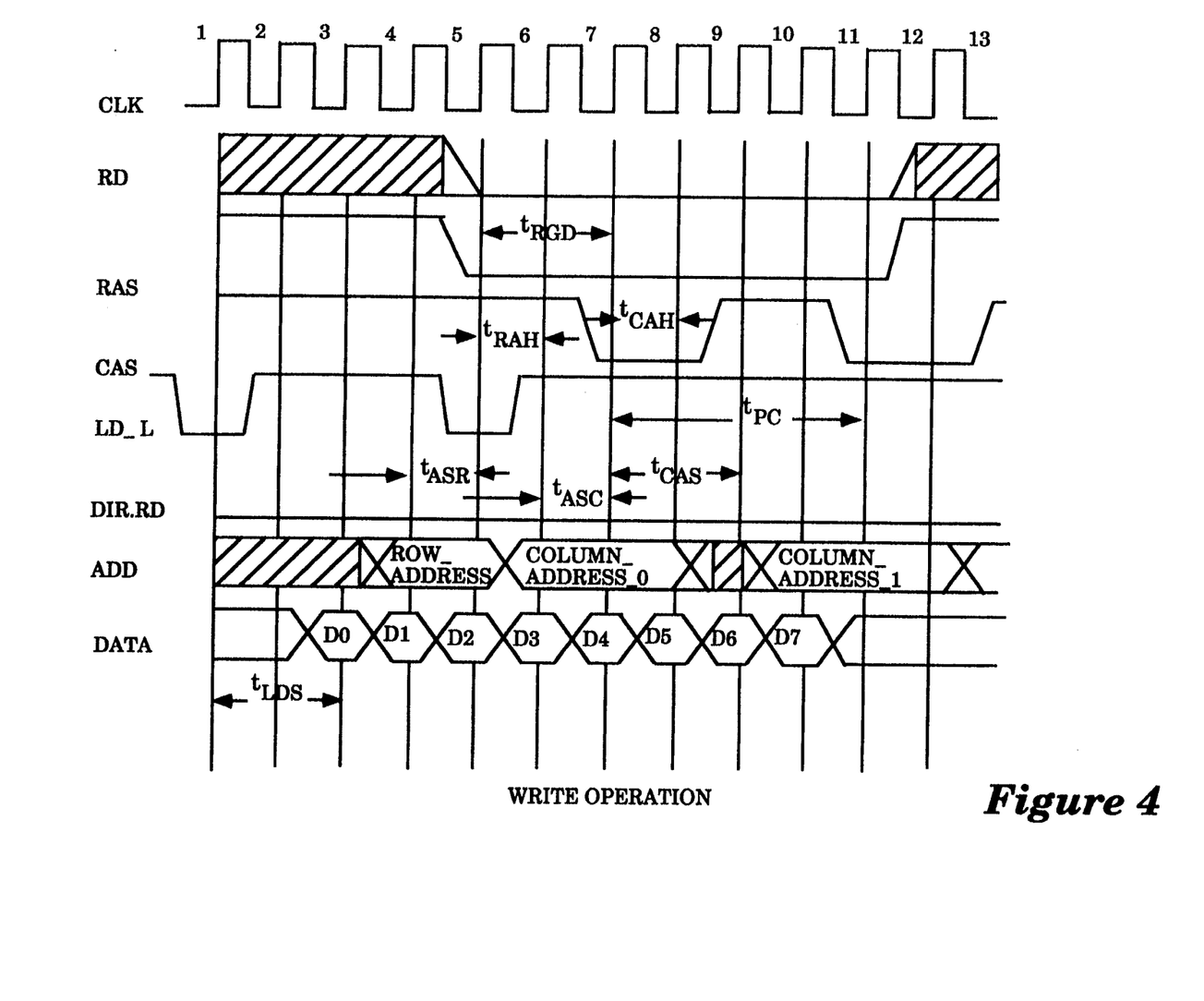
FIG. 4 is a timing diagram which illustrates a sequence of various signals employed by the present invention during a write mode.

Referring once again to FIGS. 2, 3 and 4, the sequence of operations executed by the SIMM system will be described with respect to writing data into DRAMs disposed in each SIMM. In the event that processor 10, or other I/O device, writes data into the SIMM memory array, the data as well as address of the storage location within the DRAM memory is coupled to the memory controller 16 through bus 12. Memory controller 16 applies the address for the data to be written to the memory bus 24, which is in turn coupled to SIMMs 20 through 23. In addition, the memory controller 16 applies control signals (RAS and CAS) to the memory bus 24, which are received by each CBS in the respective SIMMs. As in the case of a read operation, three bits of the address are received by each CBS disposed on a SIMM along with two control bits, CTRL1 and CTRL0. Each CBS clocks the address and control bits into registers 70, 72 and 74, respectively, and then amplifies and retransmits these signals to the DRAMs over address and control bus 50. As illustrated best in FIGS. 3 and 4, the memory controller 16 maintains the Direc.RD line in a low state, and provides an LD_L pulse to begin the write operation. Upon the receipt of the LD_L signal, counter and decoder 90 disables the output buffer 95 and enables an input buffer 120. The data to be stored is then applied by memory controller 16 to the memory bus 24, and for each CBS, four bits are provided (plus one ECC check bit) serially to the input buffer 120. Each CBS (see FIG. 3) progressively stores each four bit group of data in registers $A'_W$, $B'_W$, and $C'_W$, however, the fourth cycle to be received is stored directly in register $D_W$. When the last group of four bits of data are stored in register $D_W$, CBS shifts data stored in $A'_W$, $B'_W$, and $C'_W$ into registers $A_W$, $B_W$, and $C_W$, respectively. Once shifted into these registers, the data immediately appears on the output of the data and control bus 50, through buffers 125, 126, 127, and 128. Reference is made to FIG. 4 for an identification of the various signals and sequences of signals provided by memory controller 16, in order to accomplish a write operation using the SIMM system.

Referring to FIGS. 2 and 3, the SIMM system's use of an ID number to identify the vendor of the particular DRAMs, along with the size and speed of the DRAMs, is reported as part of an eight bit identification byte. In the event a Direc.RD signal is applied to register 78 and counter and decoder 90 without a corresponding LD_L pulse, the counter and decoder 90 signal enable ID logic circuitry 150, which couples a two bit ID value to each CBS. The two bit ID value is determined by hard wiring each of the bit lines either to ground or to Vcc (see FIG. 2). This two bit ID value is coupled through multiplexer 110, and shifted through register $A_R$, and output buffer 95, onto the memory bus 24 as data. It will be appreciated since there are four CBS devices on each SIMM, that since each CBS reports two bits of the ID byte, that a total of eight bits are reported for each SIMM.

Figure 6:
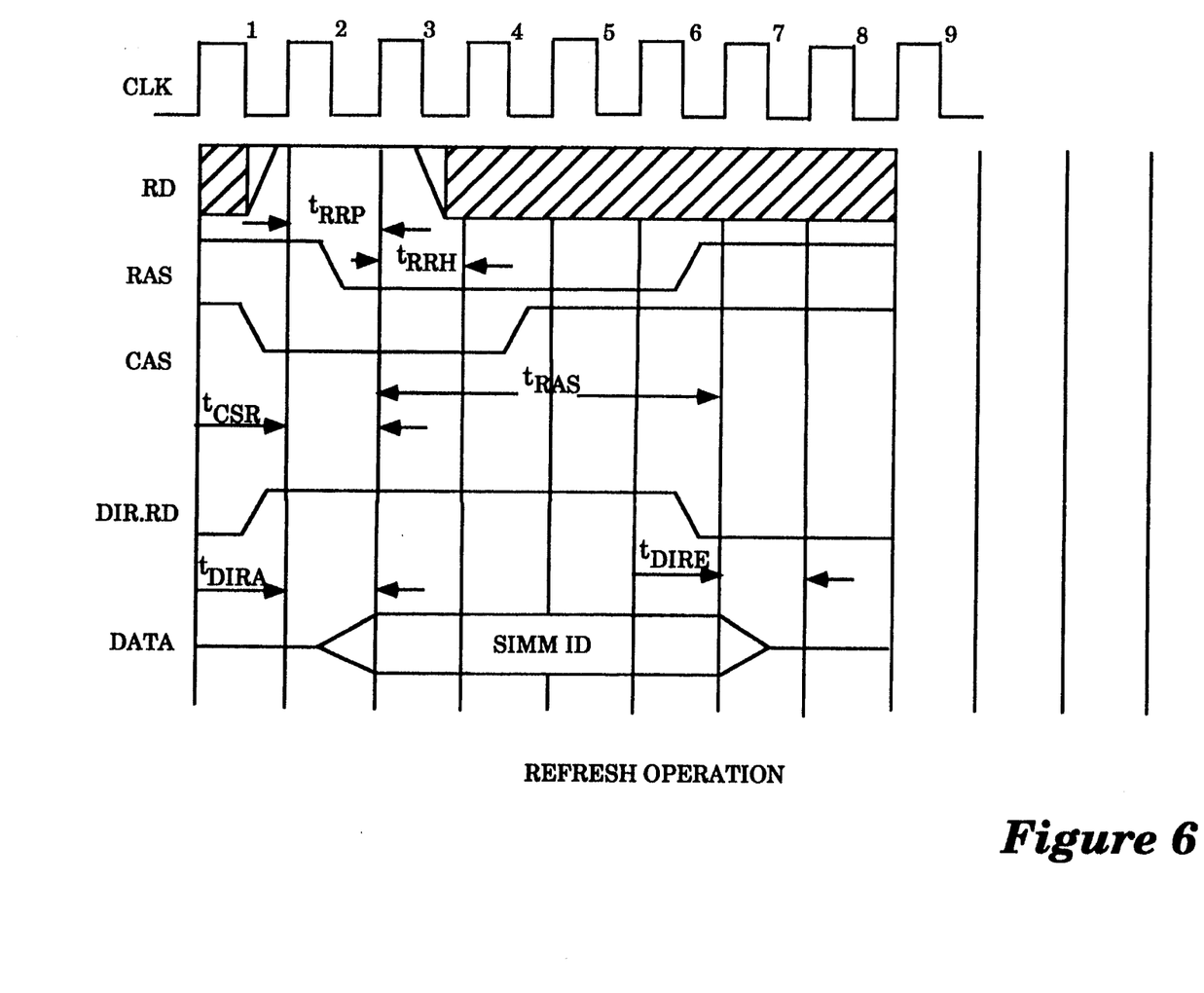
FIG. 6 is a timing diagram illustrating the sequence of operations utilized by the present invention during a refresh operation.
Figure 7:
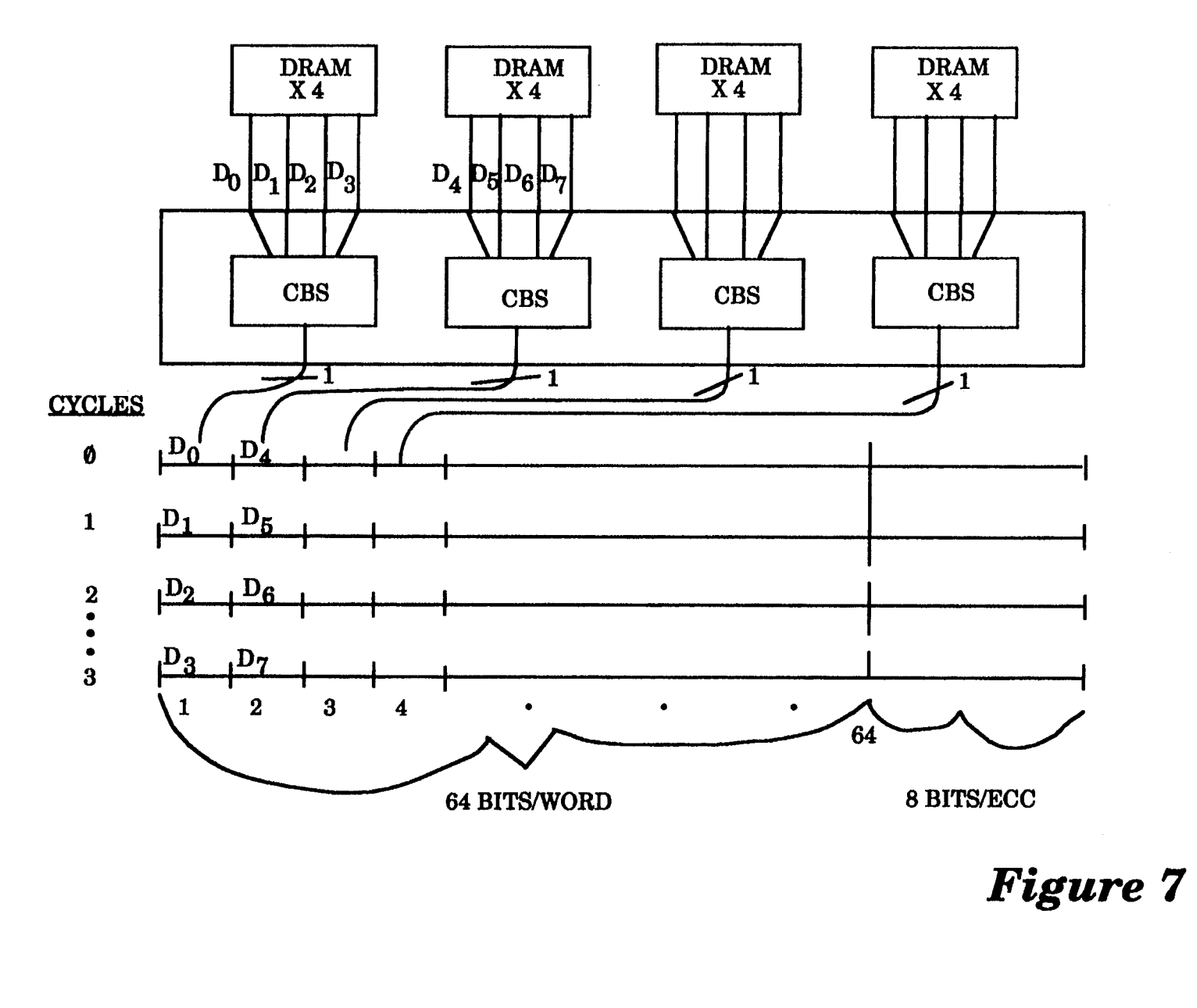
FIG. 7 conceptually illustrates the present invention's use of bit scattering to minimize data loss in the event of a DRAM malfunction.

With reference to FIG. 6, in the presently preferred embodiment memory controller 16 initiates a refresh mode which is required in accordance with the particular DRAMs utilized in the SIMM. The SIMM system incorporates circuitry such that each time the memory controller 16 generates a refresh cycle, the ID byte is coupled onto the memory bus data lines as described above. The use of the identification byte by the SIMM system permits various types of DRAMs to be incorporated in the SIMMs without the need to redesign either the SIMM architecture or CBS. In addition, no specific timing circuitry need be provided in the CBS, since all timing is completed through the memory controller 16 based on the type of DRAMs utilized as reported by the ID byte, as discussed below.

Figure 8:
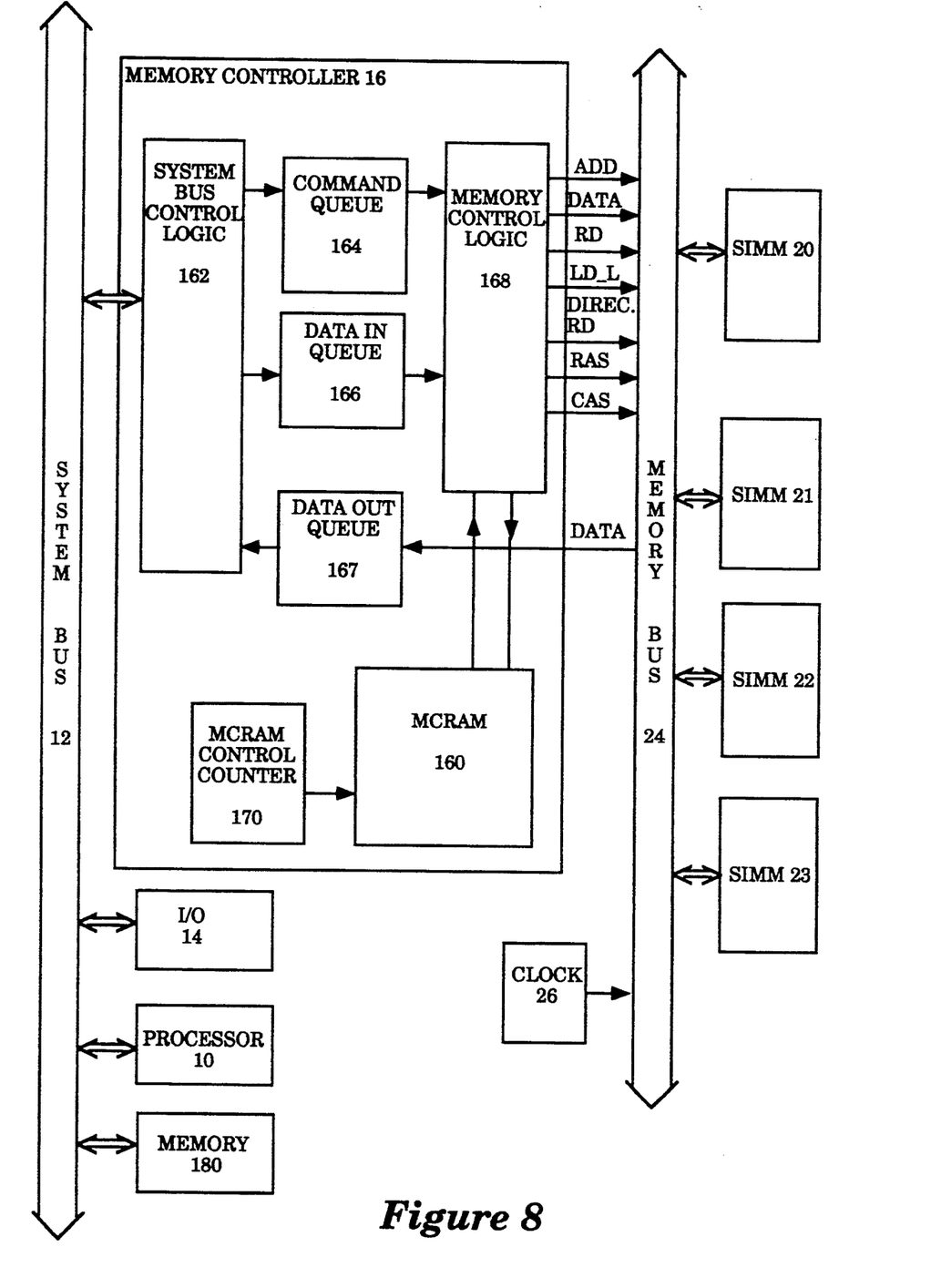
FIG. 8 is a functional block diagram illustrating the use of the MCRAM within the Memory Controller.

The timing of memory operations through the memory controller 16 based on the type of DRAMs utilized in the SIMMs will now be described. Referring to FIG. 8, a block diagram of the memory controller 16 within the data processing system is provided. In general, system bus control logic 162 couples the memory controller 16 to the system bus 12. Commands which have been placed on the system bus 12, and coupled to the memory controller 16, through system bus control logic 162, are placed in a command queue 164. Data which has been placed on the system bus 12, for example in a write operation, and coupled to the memory controller 16 through system bus control logic 162, is placed in a data-in queue 166.

As illustrated, the command queue 164 and the data-in queue 166 are coupled to memory control logic 168 which serves to couple the memory controller 16 to a memory bus 24. As discussed earlier, the multiple memory modules, SIMM 20, SIMM 21, SIMM 22, and SIMM 23, are coupled to the memory bus 24. Data which has been placed on memory bus 24 from SIMMs 20–23, for example in a read operation, is coupled to a data-out queue 167. The data-out queue 167 is further coupled to the system bus control logic 162, which provides the read data to the system bus 12.

In order to provide the necessary timing signals for memory operations, the memory controller 16 utilizes programmable memory timing means. The programmable memory timing means comprises storage elements capable of being programmed. In the presently preferred embodiment, the programmable memory timing means comprise a RAM device, seen in FIG. 8 as MCRAM 160. In the presently preferred embodiment, the MCRAM 160 is disposed within the memory controller 16. Alternatively, it will be noted that the MCRAM 160 can comprise a separate chip outside of memory controller 16, or storage elements other than a RAM device.

The MCRAM 160 provides the timing signals for the memory modules, illustrated in FIG. 8 as SIMMs 20–23. In particular, as will be described, for each of the memory operations, read, write, or refresh, the MCRAM 160 contains timing data for the RAS, CAS, LD, and AD timing signals. These timing signals are generated by reading the words, sequentially, from the MCRAM 160. The reading of the words is done under the control of an MCRAM control counter 170, and memory control logic 168. As the words within the MCRAM 160 are read sequentially, each of the RAS, CAS, LD and AD lines receives a particular stream of data from these words. These data streams comprise sequences of ones and zeroes, which are then utilized to create the sequence of the pulses needed for the RAS, CAS, LD, and AD timing signals.

Figure 9A:
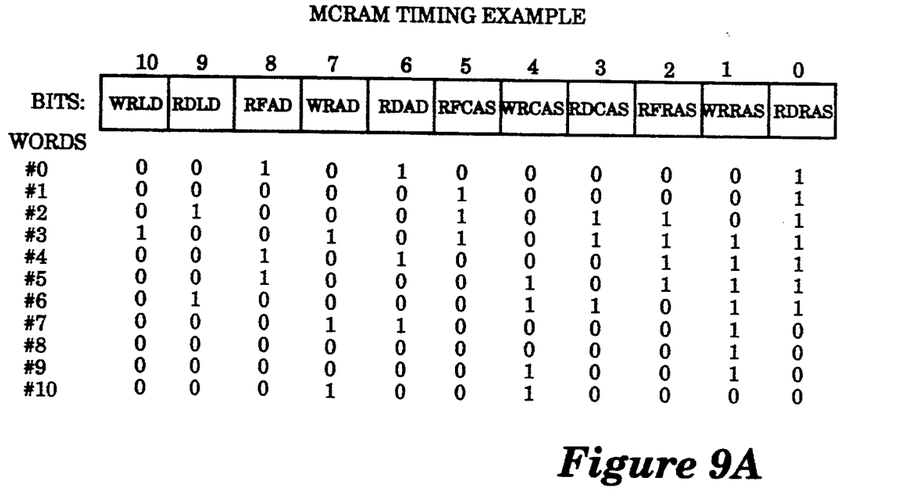
FIGS. 9A–9B illustrate an example of how the MCRAM might be loaded, and a timing diagram showing the timing signals resulting from these particular contents.

In the presently preferred embodiment, the MCRAM 160 is 11 bits wide and 20 words long. However, it will be appreciated that the present invention contemplates numerous alternative dimensions for the MCRAM 160. FIG. 9A illustrates a timing example with hypothetical timing signal data loaded into the MCRAM 160. Referring to FIG. 9A, the first three bits RDRAS, WRRAS, RFRAS, correspond to the RAS pulses for read, write and refresh operations respectively. The second three bits RDCAS, WRCAS, RFCAS, correspond to the CAS pulses for read, write, and refresh operations respectively. The third three bits correspond to the AD pulses for read, write, and refresh operations respectively. And the last two bits RDLD and WRLD correspond to the LD pulses for read and write operations respectively. A refresh operation, it can be noted, does not require an LD signal. It will be appreciated that the present invention is not limited in any way to this particular ordering of the bits. Numerous alternative orderings of the bits are readily possible, and would equally serve the purposes of the present invention.

It will be appreciated that FIG. 9A illustrates only the eleven words that are necessary to accomplish these operations. All remaining MCRAM 160 words, words 11–19, are zero. As a general rule, the MCRAM 160 word following the last AD pulse must be all zeroes to prevent spurious pulses during termination of the memory operation, and the remaining words are not currently used.

Figure 9B:
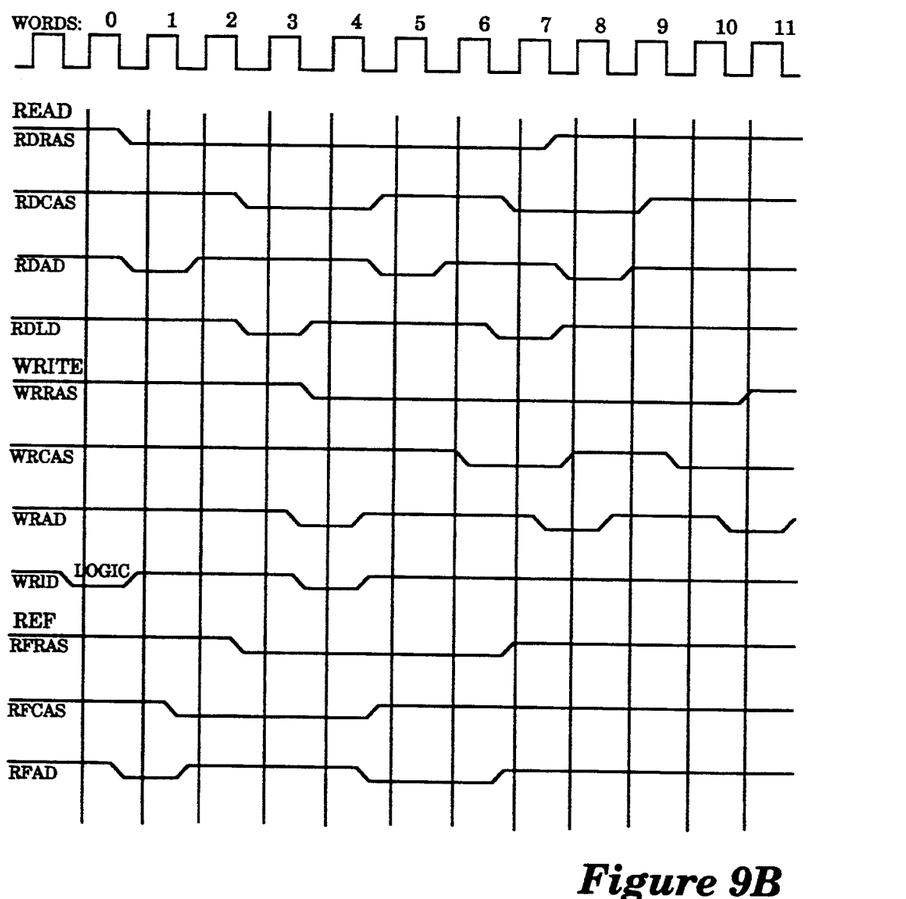

FIG. 9B illustrates the timing signals resulting from the hypothetical timing signal data of FIG. 9A. All signals are shown as active low. As previously discussed, the RAS pulses correspond to row address strobes, and the CAS pulses correspond to column address strobes. In the presently preferred embodiment, two CAS pulses, CAS0 (octaword 0) and CAS1 (octaword 1), are used to accomplish a fast page mode. The LD pulse determines the timing of the loading of the data in a read or write operation. The first AD pulse switches the memory address lines from the RAS address to the first CAS0 address. The second AD pulse switches to the second CAS1 address for the second page mode access. The third AD pulse causes termination of the operation (three clock cycles after the pulse). The first two AD pulses for reads and writes which enable CAS addresses occur two clocks before the CASs to allow one clock of address setup time. The final AD occurs during the last RAS clock cycle in order to allow a three cycle RAS precharge for back-to-back operations.

The words within the MCRAM 160, it should be noted, are assigned a specific set of addresses within the data processing system. Thus, in the preferred embodiment, this set of addresses would consist of 20 addresses corresponding to the 20 words within the MCRAM 160. It will be appreciated that the present invention is not limited in any fashion to the use of 20 words. The number of words within the MCRAM 160 is limited only by the need, at a minimum, to provide timing signals to complete the read, write, and refresh memory operations. Within the presently preferred embodiment, 20 words more than suffices to obtain the timing signals for read, write, and refresh operations.

It will be appreciated that because the timing for the data processing system is provided by MCRAM 160, which is a programmable device, the timing itself is programmable. Thus, the data processing system can account for the timing requirements of different groups of SIMMs having different DRAMs without the need to redesign any architecture within the memory controller. The programming of the timing of the presently preferred embodiment will now be described.

Figure 10:
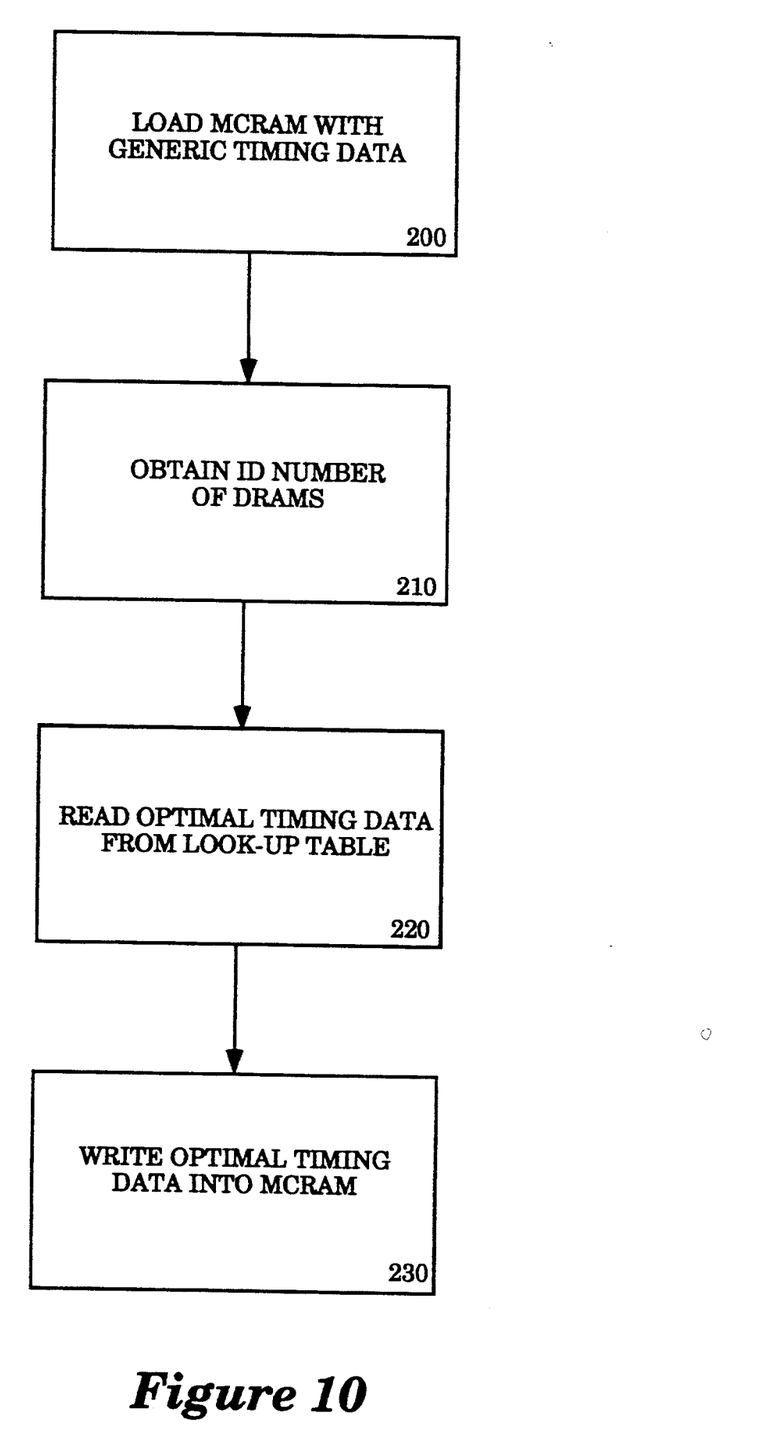
FIG. 10 is a flow chart illustrating the process of programming the MCRAM to provide optimal timing signals for memory operations.

Referring to FIGS. 8 and 10, following startup, and prior to any memory operations, the system is unaware of the type of DRAMs contained in SIMMs 20-23. Thus, the system is unaware of the optimal timing for these DRAMs as well. As illustrated in process block 200, the MCRAM 160 is first loaded with generic timing data which will generate timing signals suitable for any possible DRAM which might conceivably be used in SIMMs 20-23. This generic timing data can be thought of as a type of default, or worst case scenario, timing. Very likely, this generic timing data disadvantageously provides slow, sub-optimal timing signals for DRAMs which possess considerably faster capabilities.

The loading of generic timing signal data takes place in a series of I/O write operations. For example, the first I/O write operation is directed by the system bus control logic 162 to the address corresponding to the first word within the MCRAM 160. The second I/O write operation is then directed to the address corresponding to the second word within the MCRAM 160. Depending on the number of words, "n", needed to generate the timing signals, this series of I/O write operations continues until "n" is reached. Thus, the relevant timing signal data for generating the generic timing signals are written sequentially into the MCRAM 160.

With this generic timing data stored in MCRAM 160, a memory operation can now be initiated. As illustrated in process block 210, processor 10 then determines the identity of the particular DRAMs used within SIMMs 20-23 by initiating an I/O read operation. An I/O read is placed on the system bus 12 and directed to the address of the ID register within the SIMMs. The system bus control logic 162 then places this command on the command queue 164. When this operation comes up within the command queue 164, the command is coupled to the memory control logic 168. The memory control logic 168 incorporates circuitry such that it recognizes this command as one directed to a particular pseudo-address, namely, the ID register. (See FIG. 2.)

In the presently preferred embodiment, a refresh operation is then used to obtain the ID number. As previously described with reference to FIG. 6, the present invention incorporates circuitry such that each time the memory controller 16 generates a read or a refresh cycle, the ID number of the DRAMs within the SIMM is coupled onto the data lines of memory bus 24. Thus, it will be appreciated that a read operation can, alternatively, be used to obtain the ID number. It will further be appreciated that the use of a refresh cycle here, not necessarily to refresh the DRAMs, but instead, to simply obtain an ID number, represents a type of "dummy refresh."

With the ID number on the data line of memory bus 24, the ID number is coupled to the data out queue 167, through the system bus control logic 162, and placed on the system bus 12 to be read by the processor 10. As illustrated in process block 220, processor 10 receives this ID number from the system bus 12, and utilizes this ID number to obtain from a look-up table the timing data for the DRAM corresponding to this ID number. This look-up table is found in memory 180, accessible to the processor 10 over system bus 12. The look-up table in memory 180 contains the optimal, vendor-specific timing data for all DRAMs which might be used in SIMMs 20-23. Memory 180 can take the form of any of a number of external memory devices accessible to the processor 10, including magnetic disc or ROM. Memory 180 can also be disposed within memory controller 16, and take, for example, the form of an array of registers.

The processor 10 reads from memory 180 the timing data specific to the particular DRAM corresponding to the ID number. As illustrated in process block 230, processor 10 then writes this optimal timing data to the MCRAM 160 in a series of I/O write operations. This series of operations is analogous to the previously described series of I/O write operations with respect to the generic timing data, except that in this case, the optimal timing data is written into the MCRAM 160. From this point on, the MCRAM 160 has within it optimized timing data, specific to the DRAMs used within the SIMMs. All future memory operations can then use this optimized timing data.

The preceding method is summarized in FIG. 10 as a flowchart of the programming process. The programming process utilizes four principal stages. First, the MCRAM is loaded with generic timing data (process block 200). Second, the ID number of the DRAMs used within the SIMMs is obtained (process block 210).

Third, this ID number is used in conjunction with a look-up table to obtain the optimal timing data for the DRAMs used within the SIMMs (process block 220). Fourth, this optimal timing data is written into the MCRAM in order to provide optimal timing signals (process block 230).

Thus, the data processing system can be programmed with timing data specific to the DRAMs contained within the SIMMs. In the future, if a user desires to replace the SIMMs with a new group of memory modules having different DRAMs with different timing, the preceding programming process readily allows the data processing system to accommodate and adapt to this new group of memory modules. It will be appreciated that the apparatus and method of the present invention can be modified such that multiple MCRAMs are utilized, each MCRAM corresponding to a different SIMM, thereby allowing for example, a first type of DRAM within a first SIMM and a second type of DRAM within a second SIMM. The programming process would be altered to obtain the DRAM ID numbers for each of the individual SIMMs. These ID numbers would then be utilized in conjunction with a look-up table, and the optimal timing data would be written into each of the corresponding MCRAMs.

While the present invention has been particularly described with reference to FIGS. 1 through 10 and with emphasis on certain memory system architectures, it should be understood that the figures are for illustration only and should not be taken as limitations upon the invention. In addition, it is clear that the methods and apparatus of the present invention have utility in any application wherein data processing system accesses multiple data planes or generates multibit words. It is contemplated that many changes and modifications may be made, by one of ordinary skill in the art, without departing from the spirit and scope of the invention as disclosed above.

I claim:

1. A method of programming memory timing of a data processing system, said data processing system including a processor, a memory for storing and retrieving data in accordance with timing signals, and a memory controller for providing said timing signals to said memory, said memory controller including a programmable memory timing generator for generating said timing signals from timing data, said timing data comprising generic timing data representing generic timing signals suitable for use with a plurality of types of predetermined memory types and a plurality of memory type specific timing data, each said memory type specific timing data representing memory type specific timing signals suitable for use with a corresponding memory type of said plurality of types of predetermined memories, said data processing system further including a look-up table, said look-up table being accessible to said processor and storing said timing data, said method comprising the steps of:

loading said generic timing data into said programmable memory timing generator;

generating generic timing signals from said generic timing data and providing generic timing signals to said memory;

using said generic timing signals to access said memory to identify a specific type of memory of said memories of said processing system;

reading from said look-up table corresponding type specific timing data for said identified specific type of memory;

writing said corresponding type specific timing data for said identified specific type of memory into said programmable memory timing generator and thereby programming said identified specific timing data into said programmable memory timing generator; and generating type specific timing signals from said identified specific timing data and providing said type specific timing signals to said memory.

2. The method of programming the memory timing of a data processing system as provided in claim 1, wherein said look-up table is disposed on a magnetic disc.

3. The method of programming the memory timing of a data processing system as provided in claim 1, wherein said look-up table is disposed on a read only memory (ROM).

4. The method of programming the memory timing of a data processing system as provided in claim 1, wherein said programmable memory timing generator comprises at least one random access memory (RAM).

5. The method of programming the memory timing of a data processing system as provided in claim 1, wherein said specific type of memory is identified by an ID code provided by said memory to said memory controller.

6. The method of programming the memory timing of a data processing system as provided in claim 5, wherein said ID code is a number.

7. The method of programming the memory timing of a data processing system as provided in claim 1, wherein said memory comprises at least one dynamic random access memory (DRAM).

8. The method of programming the memory timing of a data processing system as provided in claim 7, wherein said type of DRAM is identified by an ID code provided by said DRAM to said memory controller.

9. The method of programming the memory timing of a data processing system as provided in claim 8, wherein said ID code is a number.

10. In a data processing system including a processor, a memory for storing and retrieving data in accordance with timing signals, and a memory controller for providing said timing signals to said memory, said memory controller including a programmable memory timing generator for generating said timing signals from timing data, said data processing system further including a look-up table, said look-up table being accessible to said processor and storing said timing data, said timing data comprising generic timing data representing generic timing signals suitable for use with a plurality of types of predetermined memory types and a plurality of memory type specific timing data, each said memory type specific timing data representing memory type specific timing signals suitable for use with a corresponding memory type of said plurality of types of predetermined memory types, an apparatus for programming the memory timing of said data processing system, said apparatus comprising:

generic timing loader coupled to said programmable memory timing generator, said generic timing loader for loading into said programmable memory timing generator said generic timing data;

type identifier coupled to said memory, said type identifier for identifying the specific type of memory of said data processing system using said generic timing signals to access said memory;

reader coupled to said type identifier and said look-up table, said reader for reading from said look-up table the type specific timing data corresponding to said identified memory;

writer coupled to said reader and to said programmable memory timing generator, said writer for writing said type specific timing data corresponding to said identified memory into said programmable memory timing generator after said identified memory has been identified and thereby programming said identified type specific timing data into said programmable memory timing generator so that, once programmed with said identified type specific timing data, said programmable timing generator will generate identified type specific timing signals from said identified type specific timing data and provide said identified type specific timing signals to said memory.

11. The method of programming the memory timing of a data processing system as provided in claim 10, wherein said look-up table is disposed on a magnetic disc.

12. The method of programming the memory timing of a data processing system as provided in claim 10, wherein said look-up table is disposed on a read only memory (ROM).

13. The method of programming the memory timing of a data processing system as provided in claim 10, wherein said programmable memory timing generator comprises at least one random access memory (RAM).

14. The method of programming the memory timing of a data processing system as provided in claim 10, wherein said specific type of memory is identified by an ID code provided by said memory to said memory controller.

15. The method of programming the memory timing of a data processing system as provided in claim 14, wherein said ID code is a number.

16. The method of programming the memory timing of a data processing system as provided in claim 10, wherein said memory comprises at least one dynamic random access memory (DRAM).

17. The method of programming the memory timing of a data processing system as provided in claim 16, wherein said type of DRAM is identified by an ID code provided by said DRAM to said memory controller.

18. The method of programming the memory timing of a data processing system as provided in claim 17, wherein said ID code is a number.

19. An apparatus for programmably providing N timing signals for a memory module, where N is a positive integer, each said timing signal having a period of M clock cycles, where M is a positive integer having a value at least greater than one, said apparatus comprising:

a random access memory (RAM), said RAM comprising a matrix of M lines and N columns, each line of said M lines having N memory cells and corresponding to a different one of said M clock cycles, each said memory cell of said line corresponding to a different one of said N timing signals and holding one bit of information regarding whether or not said corresponding timing signal is to be asserted during said corresponding clock cycle;

a loader coupled to said RAM, said loader for loading said matrix with said information bits;

a RAM control counter coupled to said RAM; and memory control logic coupled to said RAM, said RAM control counter controlling said RAM and causing said RAM to repeatedly cycle through said M lines sequentially selecting one of said M lines, said RAM providing said N information bits of said selected line to said memory control logic, said memory control logic mapping each said information bit of said selected line to one said timing signal of said N timing signals and asserting or not asserting at least one of said timing signals based on the value of said information bits of said selected line.

* * * * *